United States Patent
Blanc et al.

(10) Patent No.: US 6,437,985 B1
(45) Date of Patent: Aug. 20, 2002

(54) DISPOSABLE ELECTRONIC CHIP DEVICE AND PROCESS OF MANUFACTURE

(75) Inventors: Rene-Paul Blanc, Nans les Pins; Isabelle Desoutter, La Ciotat; Pierre Garnier, La Syene sur Mer; Philippe Martin, Beaune, all of (FR)

(73) Assignee: Gemplus (FR)

( * ) Notice: Subject to any disclaimer, the term of this patent is extended or adjusted under 35 U.S.C. 154(b) by 0 days.

(21) Appl. No.: 09/533,825

(22) Filed: Mar. 24, 2000

Related U.S. Application Data

(63) Continuation of application No. PCT/FR98/02051, filed on Sep. 23, 1998.

(30) Foreign Application Priority Data

Sep. 26, 1997 (FR) .............................................. 97 12444
Nov. 14, 1997 (FR) .............................................. 97 14582

(51) Int. Cl.⁷ ................................................ H05K 1/00
(52) U.S. Cl. ........................ 361/749; 361/777; 361/793; 340/572.5; 340/572.8; 340/572.7; 257/679; 257/647
(58) Field of Search ................................ 361/749, 767, 361/772, 777, 783, 793, 820; 257/647, 679; 29/831, 846; 235/491, 492, 488; 340/572.1, 572.8, 572.5, 572.7

(56) References Cited

U.S. PATENT DOCUMENTS

| | | | |
|---|---|---|---|
| 4,977,441 A | * 12/1990 | Ohtani et al. ................. | 357/70 |
| 5,528,222 A | 6/1996 | Moskowitz | |
| 5,852,289 A | * 12/1998 | Masahiko .................... | 235/492 |
| 5,982,628 A | * 11/1999 | Houdeau et al. ............ | 361/760 |
| 6,037,879 A | * 3/2000 | Tuttle .................... | 340/825.54 |
| 6,095,416 A | * 8/2000 | Grant et al. ................. | 235/449 |

FOREIGN PATENT DOCUMENTS

| EP | 0595549 A2 | 5/1994 |
|---|---|---|
| JP | 61139894 | 6/1986 |

* cited by examiner

*Primary Examiner*—David Martin
*Assistant Examiner*—Hung Bui
(74) *Attorney, Agent, or Firm*—Burns, Doane, Swecker & Mathis, L.L.P.

(57) ABSTRACT

An electronic chip device includes an interface support film having a support film and at least one flat conductive interface placed on the support film, as well as a microcircuit connected to the interface. The interface support film possesses such properties that it can be creased or folded on itself without deterioration. The support film possesses a thickness of less than 75 μm, the best results being obtained with a thickness of between 10 μm and 30 μm. Preferably the support film is selected from among polypropylene (PP), polyethylene (PE), polyethylene teraphtalate (PET). In one embodiment, the device includes a compensation film placed on the support film. The compensation film has a recess containing the microcircuit and its connections. The recess can contain a material to encapsulate the microcircuit and its connections.

44 Claims, 4 Drawing Sheets

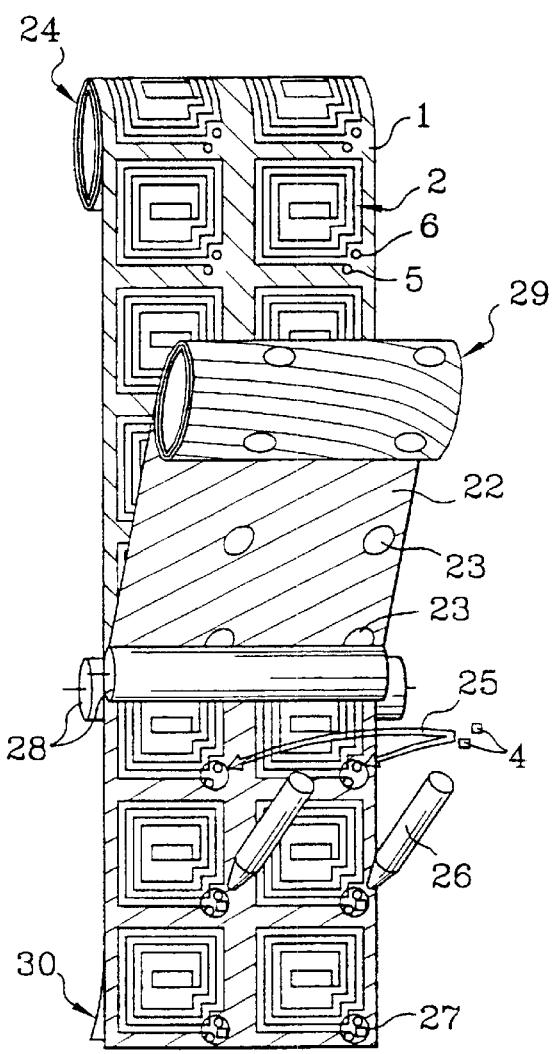
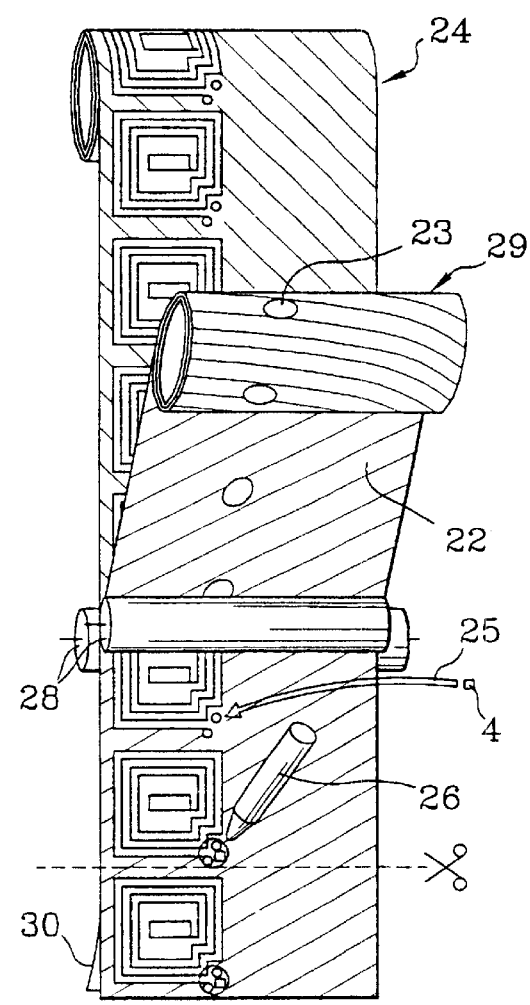
FIG.10  FIG.11
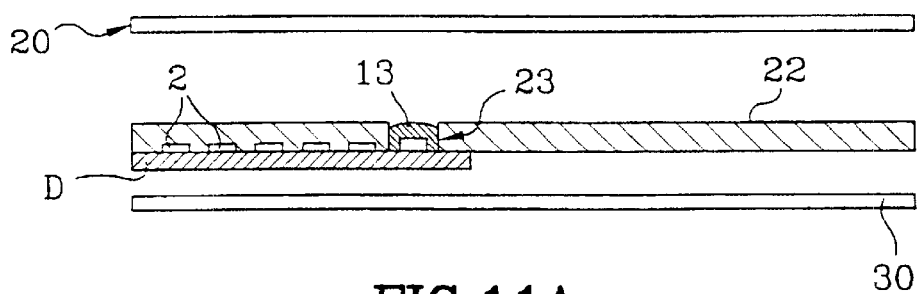
FIG.11A

DISPOSABLE ELECTRONIC CHIP DEVICE AND PROCESS OF MANUFACTURE

This applicaiton is a cont of PCT/FR98/02051 filed Sep. 23, 1998.

This disclosure is based upon, and claims priority from, French Patent Application Nos. 97/12444 and 97/14582, filed Sep. 26, 1997 and Nov. 14, 1997, respectively, the contents of which are incorporated herein by reference.

FIELD OF THE INVENTION

The present invention concerns the field of electronic chip devices comprising a communication interface, and their manufacturing process. It concerns in particular chip devices, the interface of which is by contact and/or antenna, such as chip card or label micromodule. It relates particularly to antenna devices which are disposable or used only once which can communicate over distances of more than 50 cm, especially at frequencies of several mega-herz to several giga-hertz.

BACKGROUND OF THE INVENTION

International Patent Application WO 97/26621 describes a chip and antenna module which can be scanned as a label. Cards are produced by inserting the antenna module in a cavity of a card body and certain labels are produced by packaging the antenna module in some kind of support such as a tally, for example.

These modules comprise an interface support film, commonly called a printed circuit, which contains at least one interface under the form of an antenna and/or under the form of connection pads, a microcircuit such as a chip connected to the interface and an encapsulating material to protect the microcircuit and its connections. The antenna is placed on one face of the micromodule especially on the reverse side of the latter, while the other face can possibly be equipped with connection pads.

The interface support film should possess certain mechanical properties due especially to the requirements of modern production processes. In particular, it is so flexible that it can be rolled up on reels but equally rigid so that it can be transported by sprockets engaging the side perforations. The rigidity of the interface support film is also such that it will break if folded.

The support films presently in use are selected from among epoxy glass, polyimide, and polyethylene terephtalate (PET). They have the following typical properties and characteristics: a thickness of between 75 $\mu$m and 125 $\mu$m, elongation at break of less than 75%, temperature resistance up to at least 160° C.

The interface itself is generally copper; it presents a hard surface, the tracks are in general narrow (50 to 200 $\mu$m) and have precise definition in the order of a few microns. The interface in general undergoes surface treatment for example of the Ni—Au type which makes it even harder, easier to weld and protects it from oxidation.

The devices produced according to the above requirements have the disadvantage of being too bulky for the use envisaged in the invention. In addition, they have limited applications which do not correspond to the aims of the invention listed below.

The main object of the invention is to design an electronic chip device with or without contact, powered or otherwise, which is very economic and nevertheless very reliable, and is compatible with a manufacturing process comprising the least number of operations and using the most economic standard techniques possible in such a way as to promote its use and make it disposable if required.

Another object is to design a device of the above type which can also communicate preferably beyond 50 cm (non-powered) and beyond a meter (powered).

Another object is to design and economically manufacture an antenna and/or contact module which can easily and directly be printed especially by the user.

Another object is to design a device of the above type which can be used with all reliability in a variety of conditions and on multiple supports.

Another object is to design and economically manufacture chip cards or tickets with or without contact.

SUMMARY OF THE INVENTION

Some of these objects are achieved by using an interface support film having properties totally distinct and opposite to those required for interface support films in the field of the chip cards presented above, but also by adopting a manufacturing process in a roll, then by adapting this process, especially in regard to the connection of the chip, to take into account the new properties of the film. Other objects are achieved by specific configuration of the device described below.

For this purpose the invention firstly is intended as an electronic chip device, comprising an interface support film having a support film and at least one flat conductive interface placed on the support film as well as a microcircuit connected to the interface. It is distinguished in that the interface support film possesses such properties that it can be creased or folded on itself without deterioration.

Good results have been obtained with a support film and an interface which can be creased or folded together according to a curve radius of less than 2.5 mm and preferably less than 1 mm.

This definition corresponds to the choice of a support film, the properties of which are intrinsically downgraded in comparison to state of the art support films and/or the reduced thickness combined with an interface, the intrinsic properties of which are equally downgraded in comparison to state of the art interfaces or those of reduced thickness. According to the invention, the properties of each (support film and/or interface (s)) should be considered in combination. They can in particular be enormously downgraded for both, or those of one very much downgraded and those of the other less so; the thickness of each can also be reduced to a greater or lesser extent according to the degree of downgrading of the support film and interface materials.

Due to such an association and combination, a reliable, low-cost device is provided in spite of the handling which it can be made to undergo.

It is to be noted that in certain cases the downgrading, for example in regard to rigidity, can be accompanied by other qualities in the final product, for example in regard to elasticity but which cause manufacturing difficulties. The downgrading should be understood in the context of the invention in relation to the properties presently sought in the field of chip cards.

According to one characteristic, the support film possesses a thickness of less than 75 $\mu$m, the best results being obtained with a thickness of between 10 $\mu$m and 30 $\mu$m.

With such a thin support film the invention provides not only a saving in material with a potential bearing on the price and especially a saving in the weight of the final device, thus providing new opportunities of application described below.

According to other characteristics of the invention the support film can be preferably a polymer with an elongation at break of more than 80%, and/or Shore hardness of less than 80 and/or a vitreous transition temperature Tg of less than 0° C. and/or a fusion temperature of less than 130° C.

Preferably the support film is selected from among polypropylene (PP), polyethylene (PE), polyethylene teraphtalate (PET). In other cases it can contain fibrous material, for example cellulose or textile.

The metal of the interface is preferably natural with no surface treatment aimed at hardening it, for example the Ni—Au type. Preferably it is less than 50 µm in thickness. Aluminum and its alloys are the preferred metal.

Materials such as PE, PP and PET are very economically advantageous since they are produced in very long and wide rolls in a field distinct from chipcards, such as packaging. The PE/aluminum or PP/aluminum combinations the use of which the invention proposes as a base to create an interface support film, are equally very common, especially in the field of food packaging (for yogurt lids, champagne corks, etc.)

According to another characteristic, the device comprises a microcircuit preferably situated outside the turns, especially in a corner of the support film. Preferably again the microcircuit is placed directly on the support film.

Preferably the device also comprises an interface element known as "strap" on the other face to pull back at least one end of the antenna in the vicinity of the chip.

Thus it is possible to keep free the largest printing surface possible and create a very thin device with a view to the applications detailed below, the chip being in contact with the support film. The use of the "strap" is an interesting solution explained in detail below.

According to one extra characteristic and/or another aspect and method to implement the invention, the device is distinguished in that it comprises a compensation film placed on a support film, the compensation film having a recess containing the microcircuit and its connections.

The recess can contain a material to encapsulate the microcircuit and its connections. The encapsulating material is preferably contained at least in part by the walls of the recess.

The compensation film can be used in relation with any other existing support film of the earlier type but it is more interesting to use it in relation with an interface support film which can be folded in line with the invention.

The compensation film also has advantages when manufacturing the device, that of compensating for the height of the microcircuit and of protecting it, especially to enable printing over the entire surface of the device without damaging the microcircuit.

Its function is to level out the surface of the device in such a way as to create a device without projection and to receive, if necessary, another decorative and/or adhesive layer over the microcircuit.

It also protects the microcircuit from the compression which is exerted on it when it is fixed on any kind of support by an adhesive applied especially on the compensation film.

It also allows the low mechanical strength of the interface support film to be compensated, in particular during its various uses.

It can be selected from among the most varied materials and adapted to any use, without in any way changing the process described below.

The present invention is also aimed at chip tickets and cards containing the device. Preferably they comprise a card or ticket body made up by the compensation film. This means that they have a recess which contains the microcircuit, the compensation film, the support film and the interface extending outside the recess over the surface of the compensation film.

Thus economic chip cards and tickets with protection of the microcircuit, if required, are obtained.

According to an alternative version, the recess is a non through-penetrating cavity or one enclosed by an additional film.

The present invention is also aimed at a process for manufacturing an electronic chip device comprising an interface support film having a support film and at least one flat interface as well as a microcircuit connected to the interface, the process comprising operations according to which at least one interface support film is provided and connected to the interface. This process is distinguished in that an interface support film is provided possessing properties such that it can be creased or folded on itself without deterioration.

The invention is preferably implemented according to the economic method of engraving printed or lithographed designs on one or several of the conductive surfaces, previously combined with the support film.

Due to the choice of this support film and interface but equally due to the choice of the manufacturing method of the interface, a low-cost interface support film is produced, thus contributing a reduction in the overall price of the device.

The process is also distinguished according to an extra characteristic and/or another aspect and method of implementing the invention in that it comprises an operation according to which a compensation film is fixed on the interface support film, the compensation film having at least one recess suitable as a place for a microcircuit.

This operation can be used in relation with any other existing support film of the earlier type but it is particularly interesting to use it in relation with an interface support film which can be folded in line with the invention.

The compensation film reinforces the interface support film which thus risks being more mechanically resistant during the stages of the process, in particular in the course of transport by traction.

It equally enables the support film to be coiled up flat between each stage, if necessary, or for delivery to the customer. It thus cuts out the wasted use of an interlayer film presently acting as protection between the different manufacturing stages.

Printing can be carried out on both sides of the device without damaging the microcircuit.

If the microcircuit and its connections are encapsulated, the recess of the compensation film can have a containing function. The compensation film can serve if necessary to receive side perforations for transporting and positioning sprockets and will facilitate coiling on reels with the use of present means of transport.

The compensation film enables the device to be made from various materials. It can especially be based on cellulose or any polymer, fabric or any other material in film form.

According to another method of implementing the invention without compensation film, the interface support film is supplied as rolled strip and means of transport controlled by the tension of the support film are used for feeding it to at least one work station corresponding to the stages of the process, especially the transfer of the microcircuit and/or its possible encapsulation.

Due to this arrangement it is possible to convey an interface support film that is ultra-supple and elastic without damaging it, without resorting to a compensation film, without side transporting perforation being necessary and without disturbing its positioning and/or indexation before the various work stations of the process.

According to another characteristic the microcircuit is connected by ultrasonic welding of conductor wires. More particularly, it is possible to resort to welding by aluminum wire for aluminum pads or interfaces.

Resorting to this method of connection is particularly advantageous since it is reliable, standard and economic. As explained below, this method creates difficulties which would not recommend it for use on an interface support film having properties conforming to the invention.

According to another characteristic an interface support film having interface elements on both faces is used. In particular it is possible to fit a capacitor plate on each side and/or "straps" at the same time as the interface.

Thus it is possible to reduce the manufacturing cost of these interface elements since they can be manufactured at the same time with the same technology indicated above. A less economic alternative would consist of making a bridge connection above the turns in a specific operation or the addition of a discrete capacitor.

According to another characteristic the interface elements on each side of the support film can be connected through the support film by mechanical tears and mechanical contacts. If necessary it is possible to make these connections by ultrasonic methods.

The choice of thin interface support film and the choice of materials conforming to the invention make it possible to use such a connection process. It is particularly advantageous and economic as no additional materials are needed and it can be done in one operation which can be concealed in the manufacturing process of the device.

BRIEF DESCRIPTION OF THE DRAWINGS

Other characteristics and advantages of the invention will become clear on reading the description below with simultaneous reference to the annexed drawings, given solely as examples, in which:

FIG. 10 represents a general view concerning the execution of the process of the invention;

FIG. 11 represents a general view of a variant of the process of the invention for the manufacture of chip and antenna cards;

FIG. 11A represents a card structure obtained according to the process illustrated in the previous figure.

DETAILED DESCRIPTION

Figure 1:
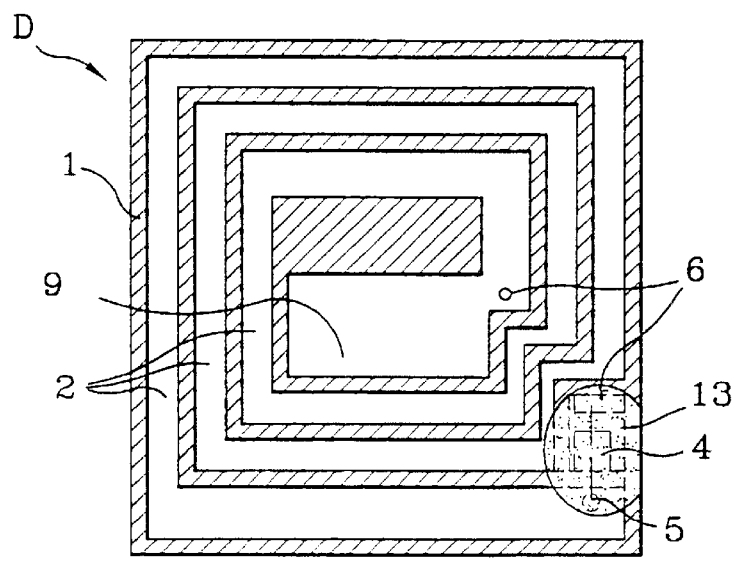
FIG. 1 represents a simplified label according to the invention identifiable at close range by radio frequency signals.
Figures 2, 3:
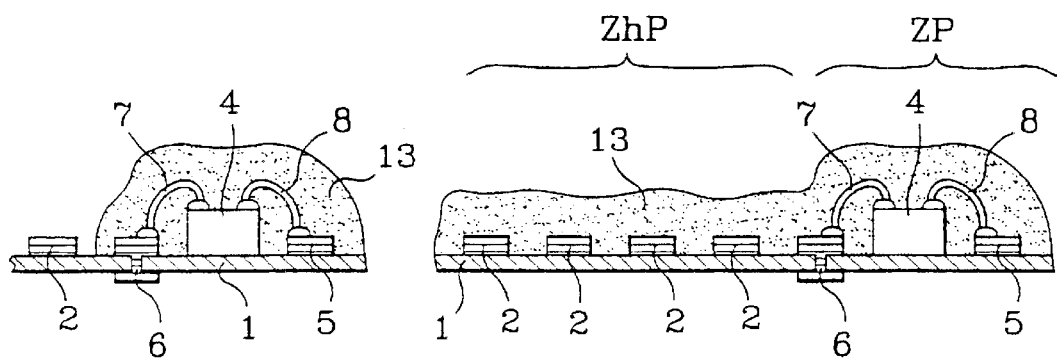
FIG. 2 represents a sectional view of the label in FIG. 1 with detail of the micromodule.
FIG. 3 represents a variant of FIG. 2.

FIGS. 1–3 show an example of a simplified method to make an electronic chip device D conforming to the invention in the form of an electronic chip and antenna label (coil and capacitor). It comprises a support film 1, a flat conductive interface made up in this example by turns 2 of a flat antenna twisted on the support film from the edge of the latter inwards, and a microcircuit 4 such as an integrated circuit chip connected to the interface. The antenna has two ends, terminating respectively internally and externally, or forming each of the contact pads 5, 6. The connection in this example is created by connecting wires 7, 8.

The device also comprises an adaptation capacitor made in this example by conductive surfaces 9, 10 placed facing each side of the support film. If required, the capacitor can comprise adjustment tracks such as perforations or other removed parts of the surface which can be achieved especially by laser. In other cases, a discrete capacitor can be bonded to the film or integrated in the microcircuit.

It is equally possible to resort to, circuit elements 11, 12 (straps) placed on the rear side of the support film (FIG. 5) to bring the contact 6 of one end of the antenna or of the capacitor plate situated inside the turns to the other end 5 situated outside the turns, or vice versa. In fact, the "strap" enables at least one end of the antenna to be pulled back in the vicinity of the space for the chip situated in this case at the end of the antenna on the edge of the label. In the case of a compensation film described below, the position of the chip is not important. It can be completely inside the turns.

According to one characteristic of the invention, an encapsulating material 13 covers at least the micro circuit and/or the connection wires in such a way as to protect them at least mechanically. In the example, (FIGS. 1, 2) the material only covers one microcircuit place zone (zp), including the connections, leaving the rest of the device bare.

In this example, the microcircuit zone occupies an area equivalent to about 4 mm×5 mm, while the label has a total surface area of 40 mm×40 mm.

Conforming to the invention the interface support film has such properties that it can be creased or folded over itself without deterioration.

Figure 12:
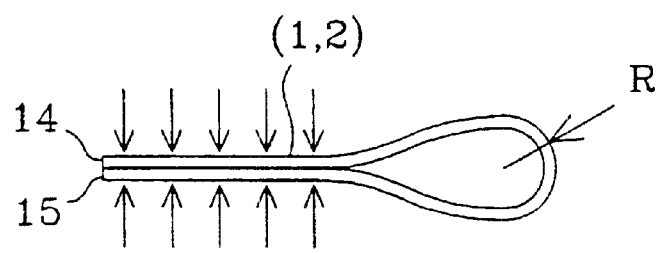
FIG. 12 represents a folding test designed to characterise the device of the invention.

FIG. 12 shows a folding test intended to characterise the invention. According to this test the interface support film must be able to be folded outside the zone of the chip for example into two or four, the opposite edges 14, 15 touching each other flat to form a fold with a shallow radius of curve which is less than 2.5 mm, and preferably less than 1 mm. In other cases, it should be possible to crumple or crease at random, the folds having at least the radius quoted above.

Deterioration is understood to mean breakage or tear of the support film leaving it unable to support the turns. It is also understood to be a serious loss of capacity to deform, then such plastic deformation which leads to breakage after renewing some of the folds. The interface itself is damaged if it loses its electrical conductive properties, especially by reduction in width, or rupture or by serious loss of elasticity which causes it to break after a few bends (for example ten).

Preferred products are obtained if they support folds with a curve radius R of less than 1 mm and especially 0.2 mm.

To achieve these performances, the support film is made of a material with elongation at break of more than 80% and/or Shore hardness of less than 80 and/or a Tg of less than zero degrees Celsius, and/or a fusion temperature of less than 130° C., linked to a thickness of less than 75 μm.

The best results are obtained with a thickness of the support film of between 10 μm and 30 μm.

The interface support films in the example are advantageously films with very downgraded properties (classified as low performance) such as PP, PE, or less downgraded (such as PET) in comparison to those currently used in card and antenna modules such as epoxy glass or the polyimides.

Conforming to the invention, the interface must also be appropriately dimensioned and/or have mechanical properties, especially ductility/elasticity/hardness compatible with those of the support film in order to satisfy the folding test of the invention. In the example the interface is aluminum without surface treatment, especially nickel, gold etc. Its thickness is less than or equal to 50 μm and preferably between 7 and 30 μm.

If necessary, according to an alternative, the support film can comprise a fibrous material, especially cellulose or textile. It can for example be simply very thin paper as above. Textile fiber materials have the property of bending without breaking and folding in a reversible way.

In FIG. 3 the thickness of protection material 13 used is the finest possible to cover all the surface of the label. The thickness obtained of the chip zone (zp) can be less than 400 μm and especially less than 300 μm for a chip having a thickness in the order of 150 μm. The thickness obtained of the zone excluding the chip (zhp) is less than 150 μm and especially less than 100 μm.

In the case of FIG. 3 it is preferable to use a protection material which keeps some elasticity and flexibility in order to satisfy the criterion of the invention defined above. Certain epoxy and acrylate resins may be suitable.

In the example of FIG. 2 tests carried out by way of at least 100 repetitive folds with a curve radius equal to 0.5 mm have been undertaken with a label without deterioration of the antenna. In the example of FIG. 3 other folding tests with a radius of 2 mm did not affect the function of the above labels.

Such handling is impossible and/or not recommended with chip and interface devices of the earlier type.

The label of the invention has the advantage that it can be incorporated in very fine and/or very flexible products and remain unnoticed to the human eye and touch while its mechanical characteristics may be close to or lower than those of the product. The product obtained can feel like a cigarette packet film or foil. Such a device can find application as an insertable discrete electronic device or one which can be placed on top, especially in fine products such as textile clothing fabric, leather, foil, film or cloth products, cardboard products and packaging but also and firstly acting as labelling for the whole item.

The device of the invention in the form of a label can also form part of the film making up the product or packaging, the antenna for example being attached to a fabric or packaging film itself.

To the extent the support itself can be fine and subject to repetitive folding, the device of the invention is capable of undergoing the resultant deformation without deterioration. It thus provides an identification function with more reliability than devices of the earlier type under such conditions of use.

Figure 4:
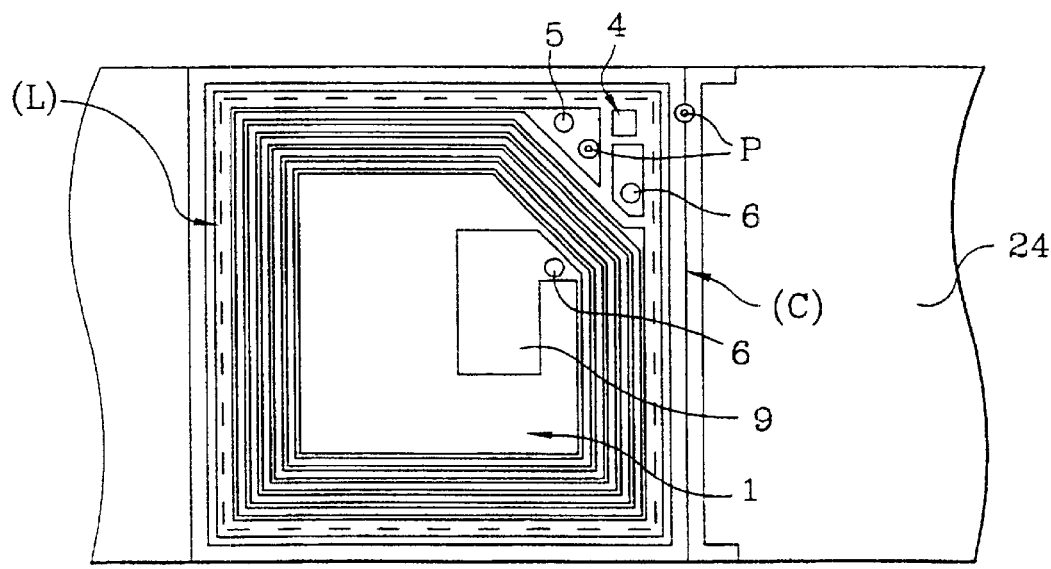
FIG. 4 represents a variant of FIG. 1.

In FIG. 4 the interface is created on a continuous strip 24 of support film 1. The microcircuit is placed advantageously in a corner of the support film and directly above it. Preferably the choice is to position the chip in the corner of the label to reduce mechanical stresses linked to handling but also to have the largest possible surface free for printing.

Strip 24 comprises a continuous conductor frame (C) around the interface and target points (P) intended for reference and indexation/positioning of the interface during the various stages of the process described below. The conductor frame enables the strip of the support film to be made more rigid and to reduce the costs and time of printing if necessary. Broken lines (L) traced on the strip represent outlines demarcating the device.

The designs of the antenna are conceived as a function of the operating frequency chosen and to optimise the range (case of close range communication).

In the example the antenna is designed on the support film in such a way as to be able to communicate over a distance of more than 8 cm and preferably more than 50 cm (not powered, i.e. without battery) and more than 1 to 2 m (powered, i.e. with battery). The turns are as large as possible and their number optimised to achieve the distances anticipated, (in general 4 to 6 turns are necessary at frequencies of about 13 MHz).

The gap between the turns depends on the manufacturing process of the antenna. In the example the distance between the turns is 1 mm compared with present devices where rather gaps of 0.05 mm to 0.4 mm are normal.

Figure 5:
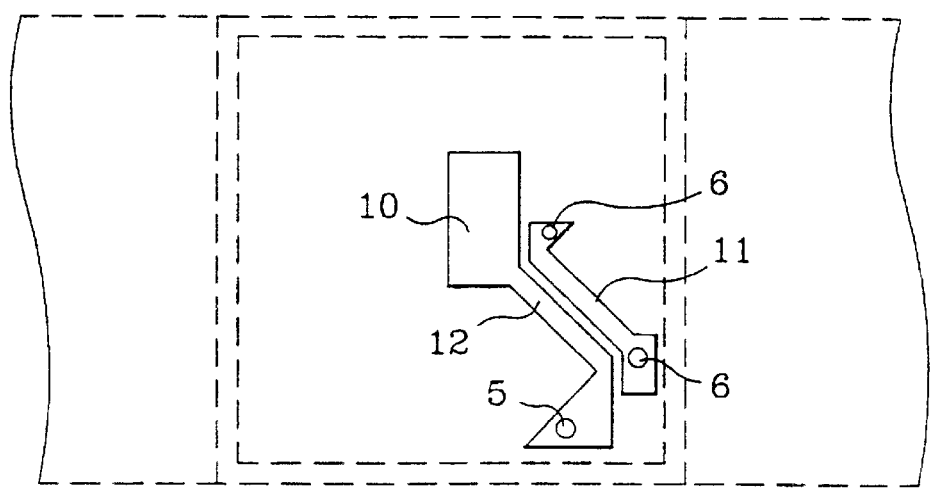
FIG. 5 represents the reverse side of the label in FIG. 4.

To connect the ends of the antenna with the microcircuit the invention preferably resorts to a design with "strap" as shown in FIG. 5.

According to another variant not shown, the device advantageously includes a capacitor not in the form of plates on each side of the film, but integrated in the chip. This provides freedom from parameter variations of the capacitor linked with variations in the thickness of the film and from operations of adjusting the antenna, which are often tedious. This is equally preferable if the support film does not have good dielectrical strength.

According to a characteristic (not shown) aimed at simplifying the device, the support film comprises interface elements on a single side, it being possible for the capacitor to be bonded onto the support film or better still in the chip, as above.

To avoid having long connection wires if the antenna has more than one turn and a relatively large pitch, the turns can be designed in such a way that their width is thinner locally than elsewhere around the mircocircuit and its connections.

Again preferably to reduce the length of the connecting wires while keeping the device to a minimum thickness, the microcircuit can be placed directly on the support film and between the turns which encircle it. The accumulation of the characteristics of this above variant again enables the costs to be reduced.

The microcircuit can also be placed over the turns but to the detriment of the height of the device and good seating for the microcircuit.

In other cases the microcircuit can be placed on an interface area in such a way as to increase stability and for better adhesion using an adhesive.

Figure 6:
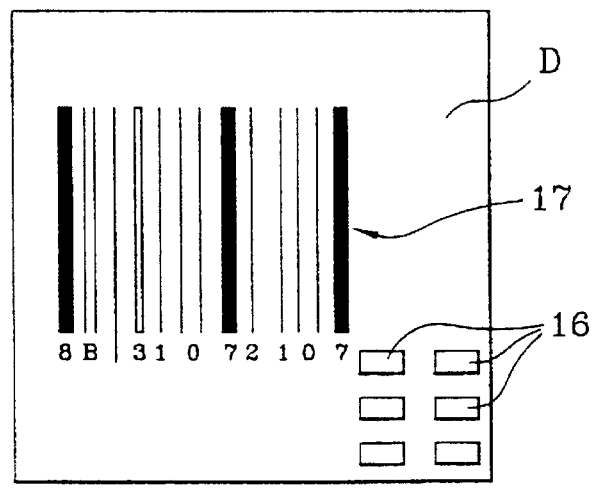
FIG. 6 represents a view of the upper part of a label with connection pads.

FIG. 6 shows that the interface of the device D comprises at least connecting pads 16 on the face visible on the drawing. The microcircuit is placed on the other face, perforations through the film providing access in a known way to the connection pads. If necessary the chip can be incorporated in the recess of a compensation film described below.

It also has in the example printing, such as bar codes 17 placed on its largest section, the connections and the chip being at the edge of the support film.

As a variant the interface can comprise both contacts and an antenna (not shown). The antenna can for example be placed on the other face not visible on the drawing.

Figure 7:
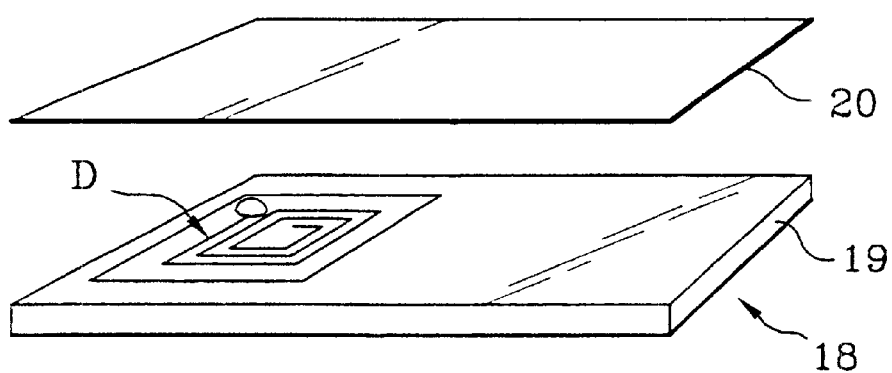
FIG. 7 represents a card structure conforming to the invention.

FIG. 7 shows a chip card 18 outside the ISO standards in force. It comprises the device (D) with the support film 2 placed on a support card body 19 which can have dimensions equal to or larger than the film, for example equal to at least twice those of the support film 2. The face of the device not carrying the chip preferably has contact with the card body 19. The microcircuit points towards the top opposite the card body 19.

The card can also have a second film 20 arranged above the support film and be of the same size as the card 19 or only cover the device.

According to a preferred variant (FIG. 8) the card 19 makes up a compensation film. It comprises a closed recess 21 in which the coated microcircuit 4 is inserted, the interface support film (1, 2) extending outside the cavity on the surface of the card body. The extension of the device outside the cavity is in no way apparent to the touch or eye due to the thinness of the interface support film. Thus a card which is flat to the touch also with a microcircuit protected by the cavity is obtained.

Conforming to other characteristics the device can also comprise a supplementary miniature resonant circuit including an emergency antenna and/or an integrated capacitor placed in the microcircuit in such a way as to compensate for any failure of the antenna or the capacitor placed on the interface support film. Thus it would be possible to recover information stored in the chip using a specific non-contact proximity reader which makes the device more reliable.

For this purpose the microcircuit can be powered and communicate without direct contact via the emergency antenna if the antenna circuit of the support film fails.

Figure 9:
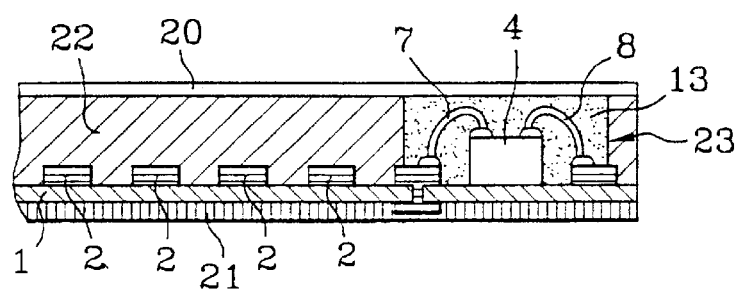
FIG. 9 represents another structure of the device provided by the invention.

FIG. 9 shows that the device comprises a compensation film 22 placed on an interface support film. The compensation film can be placed on all types of interface support film as known from the earlier type but it is more suitable and more interesting (as detailed above) with those which can be folded or creased in line with the invention.

The compensation film comprises a recess 23 in which the microcircuit 4, its connections 7, 8 and the encapsulating material 13 are located. The wall of the recess is in contact with the encapsulating material to the extent that it contains the material, at least partly.

Its thickness is preferably such that the recess 23 just exceeds the microcircuit and its encapsulation.

The compensation film can be any material, preferably flexible for the applications intended. In the example a PE polymer with a thickness equal to 200 μm for a 150 μm chip and connection with wires has been used. It has been shown that it was possible to use a compensation film of less than 50 μm for a 50 μm chip and connection of the "Flip chip" type or by applying conductive adhesive of the type "Silver glue" (as described in French Patent Application No. 97 04093 or No. 97 04094). This allows a chip device of 110 μm to be obtained in this case. It is possible to print on the film 22 itself.

The device can also comprise at least one protection/ personalisation layer 20 and/or adhesive layer 21 on at least one of the faces of the support film or the compensation film.

A label made in this way can comprise all the functions and finish of a normal label, including its electronic identification function, with the greatest applicability in view of its thinness and flexibility. If necessary a self-adhesive film can be applied on the compensation film in such a way as to direct the recess towards an object to be labelled and thus hide the presence of a chip.

As a variant the compensation film itself is a mass of adhesive of a completely known type, preferably thick and with or without a peelable protection film. In this case it is the mass of adhesive itself which compensates at least to some extent the height of the microcircuit.

The label can comprise dual identification especially by a bar code printed on the film 20 (FIGS. 9 and 6) and by a corresponding digital code stored in the memory of the integrated circuit. The manufacturing process for the devices of the invention will now be described with reference to FIGS. 10, 11 and 11A.

According to a first stage an insulating support film 1 having at least one flat conductive interface 2, 9 is provided. It is called an "interface support film" in this description.

It can be obtained by a variety of known processes such as engraving, screen printing with conductive ink, selective application of conductive material, cutting out of laminated metal and lamination on a support film, the printed circuit technique, encapsulation of conductive wires on an insulated base, etc.

In the example and according to one characteristic of the invention, preferably an engraving process for printed or lithographed designs is used on at least one conductor film previously fixed to the support film, such as by lamination or extrusion. Thus it is possible to obtain, if necessary, interfaces on each of the faces of the support film.

The support film and the interface are selected in line with the details given above relating to their mechanical properties and their thickness. The material of the metallic film in the example is aluminum, preferred over copper due especially to its price and ductility in spite of electrical performance lower than that of copper.

The choice of the engraving method requires the use of ink to mask the tracks which creates a costly removal operation after engraving. It is preferable to keep this ink on the interface to protect the aluminum against oxidation and for an aesthetic appearance apart from around the pads for connection with the microcircuit to allow welding. Local removal can be carried out especially by mechanical scraping or laser.

As a variant the interface can be formed with a conductive substance based on elastic polymer and loaded with metal particles such as conductive ink. The elasticity of the polymer base is preferably in a range which can satisfy the folding criteria of the invention. One application for example can be screen printing.

Finally at least one microcircuit is fixed on the interface support film and is connected to the interface.

All the operations are preferably carried out using strips of interface support film comprising a number of interfaces (antenna designs for example) and supplied as a roll or on reels 24. The strips are fed to the various existing stations 25 for fixing microcircuits 4, connection 26 and if necessary encapsulation 27.

Since the support film is particularly thin, fragile or tearable in conformance with the invention, it is not possible to use sprocket transport means which engage the side perforations of the films. According to the invention, transport means suitable for the properties of the film are used. In particular, means of transport controlled by tension of the support film and which comprise means to measure and/or regulate the tension of the support film to avoid damage by tearing are used. The transport can, for example, be provided by transport rollers 28 or by grips.

In the example of FIG. 10, two interface designs across the width of the film 1 are shown, but preferably widths of more than 80 mm with more designs, especially under consideration of mechanical strength and productivity, are used.

Fixing and Connection of the Microcircuit

The microcircuit can be fixed by any means, especially two-pack adhesives, thermo adhesives, photo activated compounds etc. In the example an adhesive which can be activated by ultra-violet rays is preferred especially due to its fast setting time, low temperature requirement and a reduced need for energy.

For connection there are several known ways which are proven to a greater or lesser extent and new methods such as welding by gold wire or aluminum wire, application of conductive adhesives, or those of the "Flip chip" type with the microcircuit upturned, pads facing downwards etc. In these two latter cases encapsulation can be omitted and the connecting heights are low.

Conforming to one characteristic of the invention, the microcircuit is connected by ultrasonic welding of conductor wires, preferably aluminum. This technique is not normally recommended on interface support films in line with the invention (very flexible and/or soft). In the field of the chip card, in fact, ultrasonic welding of conductor wires is reserved for hard and rigid interface support films based on epoxy glass, polyimides and interfaces of copper with surface treatment of the Ni—Au type. With the present state of ultrasonic welding it is possible to use a welding tool in the shape of a point from where the welding wire emerges. During welding the point is pressed on the metal interface pads or of the silicone chip resting on the support film.

The inventors found that attempts of ultrasonic welding carried out on interface supports based on soft materials such as PE or PP or even PET (depending on its quality) as a substitute for those currently in use and with a thickness of more than about 75 $\mu$m, for example 100 $\mu$m, were destined to failure, the welding not succeeding or being of a non-industrial or nonreproducible mediocre quality. The inventors nevertheless have succeeded in carrying out reproducible welds of industrial quality but having to deviate on this side of a certain threshold of thickness. In fact within this threshold they discovered that the thinner the material, the better the weld. This is true even with aluminum wire which is very difficult to weld. The distinct threshold depending on material is defined at about 75 $\mu$m for PE and PP.

It was possible to improve the reproducibility of the weld by placing, at least the zone of the support film (welding zone) on which the welding is to be carried out, flat on a firm and hard reference surface.

The support film is placed by mechanical means or preferably by suction. In the latter case a suction circuit is located in the area around the welding zone.

Thus it was possible to adapt a particularly economic standard welding technique in such a way as to make it reliable in the case of the invention.

An interspace film (not shown) is placed on the interface support film when the microcircuit has been fixed to it in such a way as that it can be rolled up correctly without damaging the microcircuits.

Connection of the Interface Elements

The interface connection elements arranged possibly each side of the support film can be connected through the support film by various methods known from the state of the art especially by making metallised holes by filling a hole with a conductive material or by electric discharge, etc.

Nevertheless due to the thinness of the support film of the invention and the interfaces and to their aforementioned characteristics, these connections are made advantageously by mechanical action with local perforations or tears, stamping or more advantageously by riveting or ultrasound with special tools.

This method is particularly economic as far as it does not require any extra material in an operation which can be easily integrated and in general within a time concealed in the manufacturing process of the device or of the interface support film.

Encapsulation

For the encapsulating stage the encapsulating material can be localized over a zone for placing the microcircuit or extended over all the surface of the support film. In the first case a drop of the material, for example a resin, is applied. In the second case the material can be applied by coating, screen printing etc. Preferably it is applied by spraying.

The adhesives and resins, conductive or otherwise, varnishes, can be polymerized by applying heat (thermal) localized or otherwise and/or without heat source, especially by radiation at certain wavelengths, for example UV, or by mixing two reactive agents.

The cold method especially at a temperature of less than 80° C. with a fast setting time is used for all hardening of adhesives and/or resins even intended for purposes other than encapsulating. This is assisted in certain cases by UV radiation. Preferably this is carried out at ambient temperature.

Operation to Fix the Compensation Film

Conforming to another aspect of the invention and an alternative way of implementation, the process comprises a stage according to which a compensation film 22 also shown on FIG. 10 is fixed on the interface support film (1, 2). This compensation film has at least one perforation 23 corresponding to a place for a microcircuit. In the example illustrated in FIG. 10 a strip 22 from a roll 29 comprising a number of perforations is laminated onto the support film. For this purpose pressure sensitive-adhesives and/or non-polymerizing glues are used.

This stage is preferably carried out before the microcircuit is fixed. It is also possible but more difficult to bond or fix the compensation film after the operation to fix or connect or encapsulate the microcircuit.

As already mentioned above this stage can be carried out in regard to any interface support film but it is more interesting and more significant with the interface support film which can be folded in line with the invention.

The recess advantageously serves to define a protection space for the microcircuit during later rolling up operations and storage but also serves to contain an encapsulating material which is applied in operation 27.

Supplementary Stages

The process can also include a supplementary stage consisting of applying an extra layer 30 for decoration, protection or adhesion on at least one of the two faces of the label, as shown in FIG. 11A. In the example an adhesive film 30 with its protection film is applied after transfer of the microcircuit.

Alternatively a support film already comprising at least an extra layer for example adhesive and protected by a peelable membrane can be provided.

Cutting Out and Cleaning Up Stage

Following the engraving operation a continuous frame (frame C in FIG. 4) can exist around the devices which has the advantage of reinforcing the support film during the stages of the process. This frame will finally be removed by cutting. The device can be cut for example by punching in order to extract it in bulk from a strip 24 of interface support film.

In another case it is preferable to keep the devices on a strip or roll. For this purpose it is advisable previously to fix under the strip 24 of FIG. 4, a twosided adhesive strip with removable protection film. It is cut in such a way that the protection film is left intact. A cleaning up stage then follows the cutting stage and the adhesive devices remain on the protection film.

The strip is also cut longitudinally to the desired size (splitting).

Thus rolls comprising adhesive labels in the required format with regular spacing are obtained on the protective roll of the adhesive. The label can be stuck to any product. In other cases adhesives with temporary adhesive power or non re-adhering adhesives are used which enables all the process to be carried out in a roll and allows the devices, cards, tickets, non-adhesive labels etc to be supplied in a roll.

Manufacture of Large Area Products Containing the Device

In FIG. 11 for example chip cards conforming to the invention are made. The stages and references are identical to those in FIG. 10 accept that the roll 24 comprises a single interface design row. The compensation film 22 is a foil with greater dimension that the support film and comprises a single row of perforations. The film 30 is still an optional protective and/or decorative or adhesive layer.

It is noted that this process enables cards on reels to be processed as for the tickets and labels obtained above. Processing on rolls can also extend as far as packaging and delivery up to the final user.

The compensation film can be of any kind especially paper, leather, nonwoven or woven fibers, polymers etc. In the example the compensation film is PE with a thickness equal to 200 $\mu$m and which has a surface area equal to twice that of the device.

After cutting, a chip card of FIG. 11A is obtained. If necessary a film 20 equivalent to the film 30 can be placed on the card in such a way as to hide the perforation 23.

Figure 8:
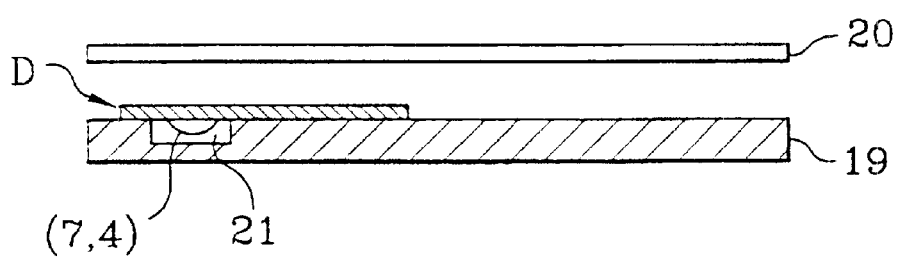
FIG. 8 represents a sectional view of another variant of the card structure.

To obtain the card in conformity with FIG. 8 the procedure illustrated in FIG. 11 is carried out, with the difference that the compensation film is bonded after the fixing and connection stages, with encapsulation if necessary. In this case the recesses 23 do not penetrate all the way through and thus form cavities 21, the compensation film becoming the card body 19 after this has been cut.

It is noted that the remarks made about FIG. 10 are valid for FIG. 11.

Conversely (not shown) a compensation film 22 which is narrower than the interface support film, in particular at the edge of the latter, can be used.

Details relating to certain problems overcome by the inventions are given below

The aim of long range communication is a problem as it is incompatible with the aim of reducing cost.

The aim of long range communication implies having a good electrical conductor as an interface. A round wire is a better conductor than a rectangular cut or engraved film; copper is a better conductor than aluminum and considerably better than ink or conductive compound. It also implies increasing the number of turns and the antenna surface which would imply increasing the surface of the circuit and space required for this. It also implies having optimised dimensions and track definition. The narrower the tracks the closer the antenna turns, the larger the configuration of the turns and therefore more important the flow.

The solution to the problem of cost, which is to downgrade the properties of interface support films, is contrary to the above. Besides this solution which culminates in retaining a very flexible interface support film (notably made from PE or PP and aluminum) especially creates the problems discussed below.

The present processes are fundamentally not suitable for such support films, never having been used to manufacture semi-conductor modules.

The flexibility of the support film is fundamentally compatible with the hardness of a silicone chip and with the fragility of the chip and its connection.

The flexibility and thinness of the support films cause problems for collective processing in the form of rolls. For example collective processing implies very good positioning necessary for the transfer and chip protection stage and more particularly for wire welding. Since such support films cannot be given transport perforations, no mechanical guide as for 35 mm films is possible.

The use of downgraded conductive materials (for example aluminum or copper without specific surface treatment in particular of the Ni—Au type) creates welding problems aggravated by oxidation problems.

The PP or PE/aluminum combinations envisaged by the inventors to serve as a base for the interface support films have printing inks which are left on the surface of the metal and which cannot be welded. Their removal is costly and causes the formation of an insulating oxide layer.

The use of an interface support film specially downgraded in regard to rigidity (absence of Ni) leads to involving soft materials which causes the welding problems described above. In addition very flexible materials in general melt at the temperatures used in the processes of the earlier type.

The solution is ideally suited, by adapting present processes for 35 mm reels, to larger reels of more than 80 mm.

What is claimed is:

1. An electronic chip device comprising an interface support film including a support film and at least one flat conductive interface placed on the support film, said interface support film having such properties that it is capable of being creased or folded over onto itself without deterioration, and a microcircuit connected to the interface, wherein the support film and the interface can be creased or folded together with a curve radius of less than 2.5 mm without deterioration.

2. The device according to claim 1, further including a compensation film placed on the interface support film, said compensation film having a recess containing said microcircuit, its connections and an encapsulating material.

3. The device according to claim 2, wherein the encapsulating material is contained at least partly by said recess.

4. The device according to claim 1, wherein the support film has at least one of an elongation at break of more than 80%, a Shore hardness of less than 80, a vitreous transition temperature Tg of less than 0°, and a fusion temperature of less than 130° C.

5. The device according to claim 1, wherein said curve radius is less than 1 mm.

6. The device according to claim 1, wherein the support film is made from a material selected from the group comprising PP, PE and PET.

7. The device according to claim 1, wherein the interface is aluminum.

8. The device according to claim 1, wherein the interface comprises turns of conductive material and the microcircuit is placed outside the turns.

9. The device of claim 1, wherein the interface comprises turns of conductive material and the microcircuit is placed in a corner of the support film and directly above the support film.

10. The device according to claim 1, wherein the interface has at least one antenna turn formed in such a way as to be able to communicate over a distance of more than 8 cm.

11. The device according to claim 10 wherein said antenna is formed such that the device can communicate over a distance more than 50 cm.

12. The device according to claim 1, wherein the interface has connection pads.

13. The device according to claim 1, further including an encapsulating material over at least the microcircuit, its connections and a portion of the interface.

14. The device according to claim 1, further including at least one of a protection/personalization film and an adhesive film over at least one of the faces of the device.

15. The device according to claim 1, further including a resonance capacitor made up of two conductive plates placed on respective sides of the support film.

16. The device according to claim 15 wherein the capacitor has an adjustment facility.

17. The device according to claim 1, wherein the microcircuit contains at least one of an integrated capacitor and an emergency antenna.

18. The device according to claim 17 wherein the microcircuit is powered and can communicate at close range via the emergency antenna if the interface of the support film fails.

19. An electronic chip device comprising an interface support film including a support film and at least one flat conductive interface placed on the support film, said interface support film having such properties that it is capable of being creased or folded over onto itself without deterioration, and a microcircuit connected to the interface, wherein the support film has a thickness of less than 75 µm.

20. The device according to claim 19 wherein the support film has a thickness between 10 µm and 30 µm.

21. An electronic chip device comprising an interface support film including a support film and at least one flat conductive interface placed on the support film, said interface support film having such properties that it is capable of being creased or folded over onto itself without deterioration, and a microcircuit connected to the interface, further including a strap on the face of the film opposite the microcircuit to pull back at least one end of the interface in the vicinity of the microcircuit.

22. An electronic chip device comprising an interface support film including a support film and at least one flat conductive interface placed on the support film, said interface support film having such properties that it is capable of being creased or folded over onto itself without deterioration, and a microcircuit connected to the interface, wherein the interface comprises an antenna having turns of conductive material and wherein the width of the turns around the microcircuit are thinner than elsewhere in such a way as to directly connect the microcircuit to ends of the interface with a small length of connecting wire.

23. An electronic chip device comprising an interface support film including a support film and at least one flat conductive interface placed on the support film, said interface support film having such properties that it is capable of being creased or folded over onto itself without deterioration, and a microcircuit connected to the interface, wherein the interface comprises an antenna having turns of conductive material and wherein the microcircuit is placed between the turns directly over the support film.

24. A chip card comprising a card body on which an electronic chip device is fixed, the card body having an area greater than or equal to that of the device, said electronic chip device comprising an interface support film including a support film and at least one flat conductive interface placed on the support film, said interface support film having such properties that it is capable of being creased or folded over onto itself without deterioration, and a microcircuit connected to the interface, wherein the support film and the interface can be folded with a radius of curvature less than 2.5 mm without deterioration.

25. The chip card of claim 24, wherein said card body has an area which is at least double that of said electronic chip device.

26. The chip card of claim 24, comprising two external films between which the electronic chip device is sandwiched.

27. The chip card of claim 26 wherein one of said external films forms said card body.

28. The chip card of claim 24, wherein said card body has a cavity and the microcircuit is located in the cavity, and wherein the support film and the interface extend outside the cavity over the surface of the card body.

29. The chip card of claim 24, wherein the support film has at least one of an elongation at break of more than 80%, a Shore hardness of less than 80, a vitreous transition temperature Tg of less than 0°, and a fusion temperature of less than 130° C.

30. The chip card of claim 24, wherein said radius of curvature is less than 1 mm.

31. A chip card comprising a card body on which an electronic chip device is fixed, the card body having an area greater than or equal to that of the device, said electronic chip device comprising an interface support film including a support film and at least one flat conductive interface placed on the support film, said interface support film having such properties that it is capable of being creased or folded over onto itself without deterioration, and a microcircuit connected to the interface, wherein said support film has a thickness less than 75 µm.

32. The chip card of claim 31 wherein said support film has a thickness between 10 µm and 30 µm.

33. A chip card comprising a card body on which an electronic chip device is fixed, the card body having an area greater than or equal to that of the device, said electronic chip device comprising an interface support film including a support film and at least one flat communication interface formed by plural turns of a conductive material on the support film, said interface support film having such properties that it is capable of being folded over onto itself with a radius of curvature less than 2.5 mm without deterioration, and a microcircuit connected to the interface.

34. The chip card of claim 33, wherein said microcircuit is disposed on said support sheet outside of said turns.

35. The chip card of claim 33, wherein said radius of curvature is less than 1 mm.

36. The chip card of claim 33, wherein said support film has a thickness less than 75 µm.

37. The chip card of claim 36, wherein said support film has a thickness between 10 µm and 30 µm.

38. The chip card of claim 33, wherein the support film has at least one of an elongation at break of more than 80%, a Shore hardness of less than 80, a vitreous transition temperature Tg of less than 0°, and a fusion temperature of less than 130° C.

39. The chip card of claim 33, further including a compensation film on the interface support film, said compensation film having a recess containing said microcircuit, its connections and an encapsulating material.

40. An electronic chip device comprising:

an interface support film including a support film and at least one communication interface formed by plural turns of a conductive material on the support film;

a microcircuit connected to the interface;

and a compensation film on the support film, said compensation film having a recess containing said microcircuit, its connections and an encapsulating material, wherein the interface support film including the communication interface and the support film can be folded or creased over onto itself without deterioration.

41. The device according to claim 40 wherein the support film has a thickness of less than 75 μm.

42. The device according to claim 41 wherein the support film has a thickness between 10 μm and 30 μm.

43. The device according to claim 40, wherein the support film has at least one of an elongation at break of more than 80%, a Shore hardness of less than 80, a vitreous transition temperature Tg of less than 0°, and a fusion temperature of less than 130° C.

44. The device according to claim 40, wherein said microcircuit is disposed on said support sheet outside of said turns.

* * * * *

(12) EX PARTE REEXAMINATION CERTIFICATE (9052nd)
United States Patent
Blanc et al.

(10) Number: US 6,437,985 C1
(45) Certificate Issued: Jun. 5, 2012

(54) DISPOSABLE ELECTRONIC CHIP DEVICE AND PROCESS OF MANUFACTURE

(75) Inventors: Rene-Paul Blanc, Nans les Pins (FR); Isabelle Desoutter, La Ciotat (FR); Pierre Garnier, La Syene sur Mer (FR); Philippe Martin, Beaune (FR)

(73) Assignee: Gemplus, S.A., Gemenos Cedex (FR)

Reexamination Request:
No. 90/010,959, May 13, 2010

Reexamination Certificate for:
Patent No.: 6,437,985
Issued: Aug. 20, 2002
Appl. No.: 09/533,825
Filed: Mar. 24, 2000

Related U.S. Application Data

(63) Continuation of application No. PCT/FR98/02051, filed on Sep. 23, 1998.

(30) Foreign Application Priority Data

Sep. 26, 1997 (FR) ............................................. 97 12444
Nov. 14, 1997 (FR) ............................................. 97 14582

(51) Int. Cl.
*H05K 1/00* (2006.01)

(52) U.S. Cl. .......................... 361/749; 361/777; 361/793; 340/572.5; 340/572.8; 340/572.7; 257/679; 257/647

(58) Field of Classification Search .................... 361/749
See application file for complete search history.

(56) References Cited

To view the complete listing of prior art documents cited during the proceeding for Reexamination Control Number 90/010,959, please refer to the USPTO's public Patent Application Information Retrieval (PAIR) system under the Display References tab.

*Primary Examiner* — Tuan H. Nguyen

(57) ABSTRACT

An electronic chip device includes an interface support film having a support film and at least one flat conductive interface placed on the support film, as well as a microcircuit connected to the interface. The interface support film possesses such properties that it can be creased or folded on itself without deterioration. The support film possesses a thickness of less than 75 μm, the best results being obtained with a thickness of between 10 μm and 30 μm. Preferably the support film is selected from among polypropylene (PP), polyethylene (PE), polyethylene teraphtalate (PET). In one embodiment, the device includes a compensation film placed on the support film. The compensation film has a recess containing the microcircuit and its connections. The recess can contain a material to encapsulate the microcircuit and its connections.

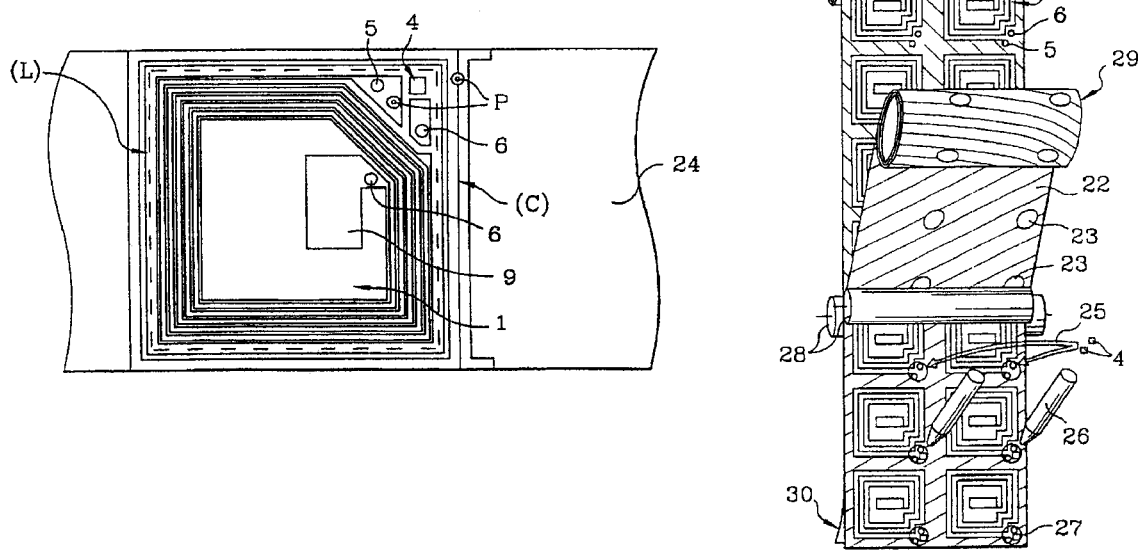

US 6,437,985 C1

EX PARTE
REEXAMINATION CERTIFICATE
ISSUED UNDER 35 U.S.C. 307

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 19, 21-24, 31 and 40 are determined to be patentable as amended.

Claims 2-18, 20, 25-30, 32-39 and 41-44 dependent, on an amended claim, are determined to be patentable.

New claims 45-62 are added and determined to be patentable.

1. An electronic chip device comprising an interface support film including a support film and at least one flat conductive interface placed on the support film, said interface support film having such properties that it is [capable of being creased or folded] *creasable or foldable* over onto itself without deterioration, and a microcircuit connected to the interface, wherein the support film and the interface [can be creased or folded] *are creasable or foldable together* with a curve radius of less than 2.5 mm without deterioration.

19. An electronic chip device comprising an interface support film including a support film and at least one flat conductive interface placed on the support film, said interface support film having such properties that it is [capable of being creased or folded] *creasable or foldable* over onto itself without deterioration, and a microcircuit connected to the interface, wherein the support film has a thickness of less than 75 µm.

21. An electronic chip device comprising an interface support film including a support film and at least one flat conductive interface placed on the support film, said interface support film having such properties that it is [capable of being creased or folded] *creasable or foldable* over onto itself *with a radius of curvature less than 2.5 mm* without deterioration, and a microcircuit connected to the interface, further including a strap on the face of the film opposite the microcircuit to pull back at least one end of the interface in the vicinity of the microcircuit.

22. An electronic chip device comprising an interface support film including a support film and at least one flat conductive interface placed on the support film, said interface support film having such properties that it is [capable of being creased or folded] *creasable or foldable* over onto itself *with a radius of curvature less than 2.5 mm* without deterioration, and a microcircuit connected to the interface, wherein the interface comprises an antenna having turns of conductive material and wherein the width of the turns around the microcircuit are thinner than elsewhere in such a way as to directly connect the microcircuit to ends of the interface with a small length of connecing wire.

23. An electronic chip device comprising an interface support film including a support film and at least one flat conductive interface placed on the support film, said interface support film having such properties that it is [capable of being creased or folded] *creasable or foldable* over onto itself without deterioration, and a microcircuit connected to the interface, wherein the interface comprises an antenna having turns of conductive material and wherein the microcircuit is placed between the turns directly over the support film.

24. A chip card comprising a card body on which an electronic chip device is fixed, the card body having an area greater than or equal to that of the device, said electronic chip device comprising an interface support film including a support film and at least one flat conductive interface placed on the support film, said interface support film having such properties that it is [capable of being creased or folded] *creasable or foldable* over onto itself without deterioration, and a microcircuit connected to the interface, wherein the support film and the interface [can be folded] *are foldable* with a radius of curvature less than 2.5 mm without deterioration.

31. A chip card comprising a card body on which an electronic chip device is fixed, the card body having an area greater than or equal to that of the device, said electronic chip device comprising an interface support film including a support film and at least one flat conductive interface placed on the support film, said interface support film having such properties that it is [capable of being creased or folded] *creasable or foldable* over onto itself without deterioration, and a microcircuit connected to the interface, wherein said support film has a thickness less than 75 µm.

33. A chip card comprising a card body on which an electronic chip device is fixed, the card body having an area greater than or equal to that of the device, said electronic chip device comprising an interface support film including a support film and at least one flat communication interface formed by plural turns of a conductive material on the support film, said interface support film having such properties that it is [capable of being folded] *foldable* over onto itself with a radius of curvature less than 2.5 mm without deterioration, and a microcircuit connected to the interface.

40. An electronic chip device comprising:
an interface suppot film including a support film and at least one communication interface formed by plural turns of a conductive material on the support film;
a microcircuit connected to the interface;
and a compensation film on the support film, said compensation film having a recess containing said microcircuit, its connections and an encapsulating material, wherein the interface support film including the communication interface and the support film [can be folded or creased] *is foldable or creasable* over onto itself without deterioration.

45. *The device according to claim 1, wherein the microcircuit comprises an integrated circuit chip.*

46. *The device according to claim 1, wherein the interface comprises a plurality of turns forming an antenna, the plurality of turns forming the antenna being disposed on only one face of the support film.*

47. *The device according to claim 19, wherein the microcircuit comprises an integrated circuit chip.*

48. *The device according to claim 19, wherein the interface comprises a plurality of turns forming an antenna, the plurality of turns forming the antenna being disposed on only one face of the support film.*

49. The device according to claim 21, wherein the microcircuit comprises an integrated circuit chip.

50. The device according to claim 21, wherein the interface comprises a plurality of turns forming an antenna, the plurality of turns forming the antenna being disposed on only one face of the support film.

51. The device according to claim 22, wherein the microcircuit comprises an integrated circuit chip.

52. The device according to claim 22, wherein the turns forming the antenna are disposed on only one face of the support film.

53. The device according to claim 23, wherein the microcircuit comprises an integrated circuit chip.

54. The device according to claim 23, wherein the turns forming the antenna are disposed on only one face of the support film.

55. The chip card according to claim 24, wherein the microcircuit comprises an integrated circuit chip.

56. The chip card according to claim 24, wherein the interface comprises a plurality of turns forming an antenna, the plurality of turns forming the antenna being disposed on only one face of the support film.

57. The chip card according to claim 31, wherein the microcircuit comprises an integrated circuit chip.

58. The chip card according to claim 31, wherein the interface comprises a plurality of turns forming an antenna, the plurality of turns forming the antenna being disposed on only one face of the support film.

59. The chip card according to claim 33, wherein the microcircuit comprises an integrated circuit chip.

60. The chip card according to claim 33, wherein the plural turns form an antenna, the plural turns forming the antenna being disposed on only one face of the support film.

61. The device according to claim 40, wherein the microcircuit comprises an integrated circuit chip.

62. The device according to claim 40, wherein the plural turns form an antenna, the plural turns forming the antenna being disposed on only one face of the support film.

* * * * *